(12) United States Patent
Neiderman et al.

(10) Patent No.: US 11,975,922 B2
(45) Date of Patent: May 7, 2024

(54) HOLD DOWN TRAY CONVEYOR

(71) Applicant: Illinois Tool Works Inc., Glenview, IL (US)

(72) Inventors: John Neiderman, Camdenton, MO (US); Scotty Slavens, Lebanon, MO (US); Eric Wayne Becker, Phillipsburg, MO (US)

(73) Assignee: Illinois Tool Works Inc., Glenview, IL (US)

( * ) Notice: Subject to any disclaimer, the term of this patent is extended or adjusted under 35 U.S.C. 154(b) by 116 days.

(21) Appl. No.: 17/392,421

(22) Filed: Aug. 3, 2021

(65) Prior Publication Data

US 2022/0055839 A1 Feb. 24, 2022

Related U.S. Application Data

(60) Provisional application No. 63/067,066, filed on Aug. 18, 2020.

(51) Int. Cl.
*B65G 15/30* (2006.01)
*B08B 3/02* (2006.01)
(Continued)

(52) U.S. Cl.
CPC .............. *B65G 15/30* (2013.01); *B08B 3/022* (2013.01); *B08B 13/00* (2013.01); *H01L 21/67706* (2013.01)

(58) Field of Classification Search
CPC ......... B08B 13/00; B08B 3/022; B65G 15/30; H01L 21/67706
See application file for complete search history.

(56) References Cited

U.S. PATENT DOCUMENTS 3,768,208 A 10/1973 Plichta et al.
4,755,252 A 7/1988 Held
(Continued)

FOREIGN PATENT DOCUMENTS

CN 209684616 U * 11/2019
JP 5626069 B2 * 11/2014
(Continued)

OTHER PUBLICATIONS

Machine Translation of JP 5626069 to Iwabe, Nov. 2014. (Year: 2014).*

(Continued)

*Primary Examiner* — Benjamin L Osterhout
(74) *Attorney, Agent, or Firm* — Lando & Anastasi, LLP

(57) ABSTRACT

A conveyor system is configured to transport the electronic substrates through the cleaning modules of a cleaning apparatus. The conveyor system includes a first outer frame member, a second outer frame member spaced from the first outer frame member, a bottom belt disposed between the first outer frame member and the second outer frame member, and a top belt spaced from the bottom belt. The bottom belt and the top belt are configured to receive a product carrier therebetween to transport electronic substrates along the conveyor system and through the cleaning modules. The conveyor system further includes a plurality of roller assemblies, with at least one roller assembly being coupled to the first outer frame member and at least one roller assembly being coupled to the second outer frame member. Each roller assembly is configured to apply a force on the top belt or the bottom belt.

19 Claims, 4 Drawing Sheets

(51) Int. Cl.
   *B08B 13/00*    (2006.01)
   *H01L 21/677*   (2006.01)

(56) References Cited

U.S. PATENT DOCUMENTS 6,021,790 A * 2/2000 Yoshitani .......... H01L 21/67706
                                                         134/122 R
2009/0178695 A1  7/2009 Becker et al.

FOREIGN PATENT DOCUMENTS

JP    2017224644 A    12/2017
WO    2005012144 A1    2/2005

OTHER PUBLICATIONS

Machine Translation of CN 209684616 to Ji, Nov. 2019. (Year: 2019).*
Notification of Transmittal of the International Search Report and the Written Opinion of the International Searching Authority from corresponding PCT/US2021/044338 dated Nov. 2, 2021.

* cited by examiner

HOLD DOWN TRAY CONVEYOR

RELATED APPLICATIONS

This application claims priority under 35 U.S.C. § 119(e) to U.S. Provisional Application Ser. No. 63/067,066 titled "HOLD DOWN TRAY CONVEYOR" filed on Aug. 18, 2020, which is herein incorporated by reference in its entirety.

BACKGROUND OF THE DISCLOSURE

1. Field of the Disclosure

This application relates generally to an apparatus for cleaning electronic substrates, including printed circuit boards and semiconductor product assemblies, and, more particularly, to a hold down tray conveyor that is configured to secure electronic substrates in place during a cleaning operation.

2. Discussion of Related Art

Various types of liquid cleaning apparatus are used to clean electronic substrates for removal of contaminates, such as flux residues, resins and the like. These contaminates remain on the electronic substrate from the soldering process.

The soldering process has recently advanced in two significant ways—the transition from tin-lead solder to lead-free materials and the reduction in the size of electronic substrate and the associated increase in the density of smaller, low-profile components. These new soldering materials have increased temperature requirements for soldering and are typically formulated to have higher flux content by weight. The combination of lead-free processes and new electronic substrate designs are demanding more time and energy to meet industry cleanliness standards.

Electronic substrates are transported within such cleaning machines by a conveyor, and must be adequately secured during the cleaning process.

SUMMARY OF THE DISCLOSURE

One aspect of the present disclosure is directed to a cleaning apparatus for cleaning electronic substrates including printed circuit boards and semiconductor product assemblies. In one embodiment, the cleaning apparatus comprises at least one cleaning module configured to treat electronic substrates and a conveyor system configured to transport the electronic substrates through the at least one cleaning module. The conveyor system includes a first outer frame member, a second outer frame member spaced from the first outer frame member, a bottom belt disposed between the first outer frame member and the second outer frame member, and a top belt spaced from the bottom belt. The bottom belt and the top belt are configured to receive a product carrier therebetween to transport electronic substrates along the conveyor system and through the at least one cleaning module. The conveyor system further includes a plurality of roller assemblies, with at least one roller assembly being coupled to the first outer frame member and at least one roller assembly being coupled to the second outer frame member. Each roller assembly is configured to apply a force on one of the top belt and the bottom belt.

Embodiments of the cleaning apparatus further may include a control module having a user interface to provide an operator the ability to program and monitor the cleaning apparatus. The roller assemblies may be evenly spaced along inner surfaces of the first and second outer frame members and configured to engage the top belt to apply force on the top belt to secure the product carrier during transport along the conveyor system. Each of the first and second outer frame members may be C-shaped in construction with a channel of the first outer frame member facing a channel of the second outer frame member. Each outer frame member further may include a plurality of slotted openings formed in line along a length of the member, with each slotted opening being configured to receive a roller assembly. Each roller assembly may include a roller, a slide bolt to secure the roller to the outer frame member, and a guide pin to guide a vertical movement of the roller. The slide bolt may extend through the slotted opening and is secured to the outer frame member by a nut, with the roller being rotatably mounted on the slide bolt to enable the roller to freely rotate about an axis of the slide bolt. The guide rod may be mounted on one end to an upper flange of the outer frame member and an opposite end to the slide bolt. Each guide rod may have a spring that is retained between the upper flange of the outer frame member and a body of the slide bolt, with the spring being configured to apply force on the slide bolt and the roller. The at least one module may include at least one of a pre-wash module, a wash module, a pre-rinse module, a rinse module, and a dry module.

Another aspect of the present disclosure is directed to a conveyor system configured to transport the electronic substrates through the at least one cleaning module of a cleaning apparatus. In one embodiment, the conveyor system comprises a first outer frame member, a second outer frame member spaced from the first outer frame member, a bottom belt disposed between the first outer frame member and the second outer frame member, and a top belt spaced from the bottom belt. The bottom belt and the top belt are configured to receive a product carrier therebetween to transport electronic substrates along the conveyor system and through the at least one cleaning module. The conveyor system further includes a plurality of roller assemblies, with at least one roller assembly being coupled to the first outer frame member and at least one roller assembly being coupled to the second outer frame member. Each roller assembly is configured to apply a force on one of the top belt and the bottom belt.

Embodiments of the conveyor system further may include evenly spacing the roller assemblies along inner surfaces of the first and second outer frame members and configuring the roller assemblies to engage the top belt to apply force on the top belt to secure the product carrier during transport along the conveyor system. Each of the first and second outer frame members may be C-shaped in construction with a channel of the first outer frame member facing a channel of the second outer frame member. Each outer frame member further may include a plurality of slotted openings formed in line along a length of the member, each slotted opening being configured to receive a roller assembly. Each roller assembly may include a roller, a slide bolt to secure the roller to the outer frame member, and a guide pin to guide a vertical movement of the roller. The slide bolt may extend through the slotted opening and may be secured to the outer frame member by a nut, with the roller being rotatably mounted on the slide bolt to enable the roller to freely rotate about an axis of the slide bolt. The guide rod may be mounted on one end to an upper flange of the outer frame member and an opposite end to the slide bolt. Each guide rod may have a spring that is retained between the upper flange of the outer frame member and a body of the slide bolt, with the spring being configured to apply force on the slide bolt and the roller.

Yet another aspect of the present disclosure is directed to a method for cleaning electronic substrates with the cleaning apparatus described herein. The method comprises loading electronic substrates in a carrier device, transporting the carrier device by the conveyor system through the at least one cleaning module, and performing a cleaning operation.

BRIEF DESCRIPTION OF THE DRAWINGS

The accompanying drawings are not intended to be drawn to scale. In the drawings, each identical or nearly identical component that is illustrated in various figures is represented by a like numeral. For purposes of clarity, not every component may be labeled in every drawing. In the drawings.

DETAILED DESCRIPTION OF THE DISCLOSURE

Figure 1:
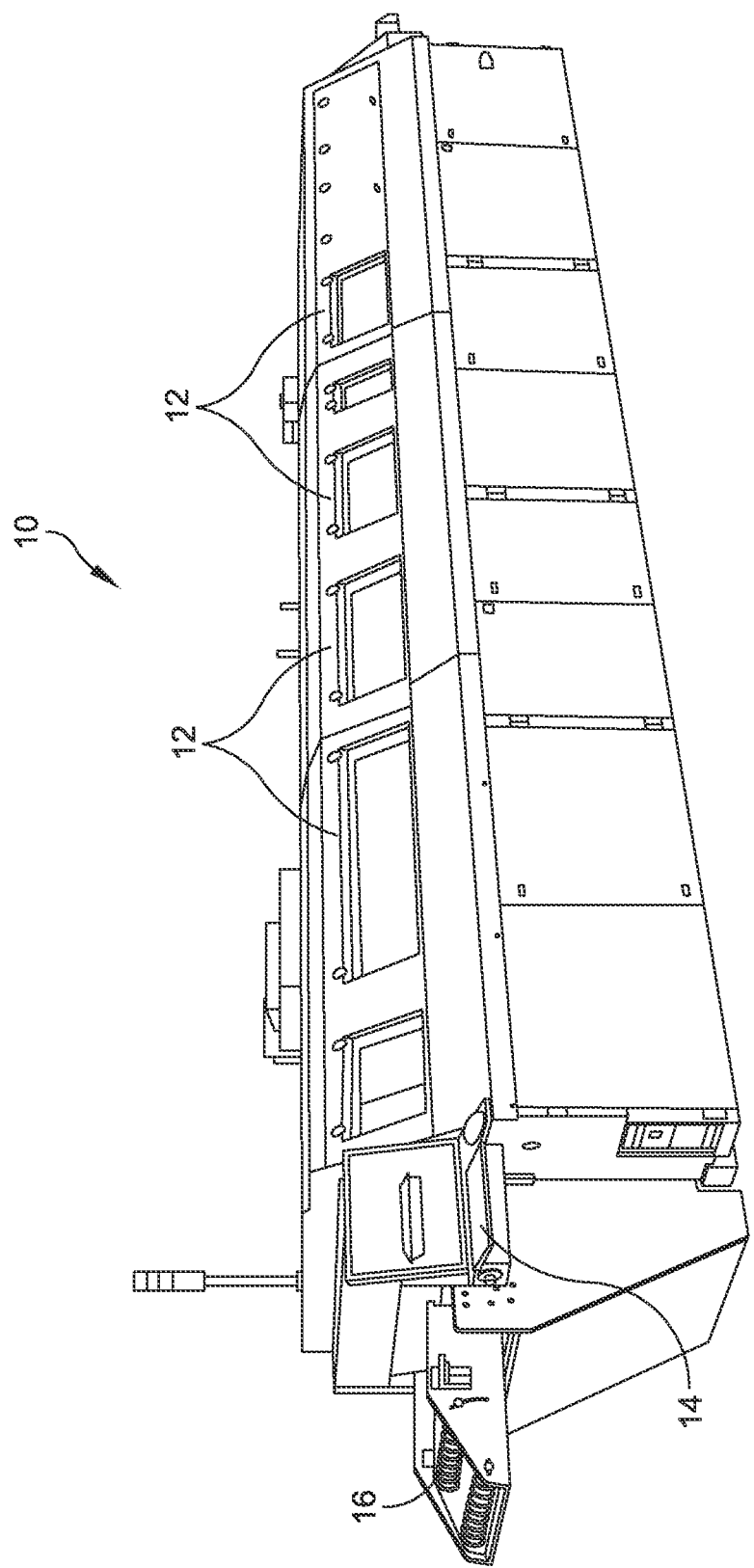
FIG. 1 is a perspective view of an electronic substrate cleaning apparatus.

Solder paste is routinely used in the assembly of electronic substrates, including printed circuit boards and semiconductor product assemblies, where the solder paste is used to join electronic components to the substrate. Solder paste includes solder for joint formation and flux for preparing metal surfaces for solder attachment. The solder paste may be deposited onto the metal surfaces (e.g., electronic pads) provided on the electronic substrate by using any number of application methods. In one example, a stencil printer may employ a squeegee to force the solder paste through a metallic stencil laid over an exposed surface of the electronic substrate. In another example, a dispenser may dispense solder paste material onto specific areas of the electronic substrate. Leads of an electronic component are aligned with and impressed into the solder deposits to form the assembly. In reflow soldering processes, the solder is then heated to a temperature sufficient to melt the solder and cooled to permanently couple the electronic component, both electrically and mechanically, to the electronic substrate. The solder typically includes an alloy having a melting temperature lower than that of the metal surfaces to be joined. The temperature also must be sufficiently low so as to not cause damage to the electronic component. In certain embodiments, the solder may be a tin-lead alloy. However, solders employing lead-free materials may also be used. Another process to attach components onto electronic substrates is a wave soldering process.

In the solder, the flux typically includes a vehicle, solvent, activators and other additives. The vehicle is a solid or nonvolatile liquid that coats the surface to be soldered and can include rosin, resins, glycols, polyglycols, polyglycol surfactants, and glycerine. The solvent, which evaporates during the pre-heat and soldering process, serves to dissolve the vehicle activators, and other additives. Examples of typical solvents include alcohols, glycols, glycol esters and/or glycol ethers and water. The activator enhances the removal of metal oxide from the surfaces to be soldered. Common activators include amine hydrochorides, dicarboxylic acids, such as adipic or succinic acid, and organic acids, such as citric, malic or abietic acid. Other flux additives can include surfactants, viscosity modifiers and additives for providing low slump or good tack characteristics for holding the components in place before reflow.

As mentioned above, the soldering processes described herein demand that the electronic substrate be cleaned prior to being released for use. Disclosed herein is an inline cleaning process to remove undesired contaminations from manufacturing processes. In one embodiment, a conveyor system is configured to transport products through a cleaning machine. An active top conveyor belt is combined with the normal conveyor transportation system to provide proper retention of electronic substrates or substrate containers during the cleaning process. The active top conveyor belt can properly retain substrates, e.g., semiconductor products, in singular form or in tray form, e.g., Jedec tray form. The proper retention eliminates movement or disruption during the cleaning process.

It is to be appreciated that embodiments of the systems and apparatuses discussed herein are not limited in application to the details of construction and the arrangement of components set forth in the following description or illustrated in the accompanying drawings. The systems and apparatuses are capable of implementation in other embodiments and of being practiced or of being carried out in various ways. Examples of specific implementations are provided herein for illustrative purposes only and are not intended to be limiting. Also, the phraseology and terminology used herein is for the purpose of description and should not be regarded as limiting. The use herein of "including," "comprising," "having," "containing," "involving," and variations thereof is meant to encompass the items listed thereafter and equivalents thereof as well as additional items. References to "or" may be construed as inclusive so that any terms described using "or" may indicate any of a single, more than one, and all of the described terms. Any references to front and back, left and right, top and bottom, upper and lower, and vertical and horizontal are intended for convenience of description, not to limit the present systems and methods or their components to any one positional or spatial orientation.

Referring now to the drawings, and more particularly to FIG. 1, an electronic substrate cleaning apparatus is generally indicated at 10. As shown, the cleaning apparatus 10 is an elongate structure that includes several modules, each indicated at 12, to clean and process electronic substrates. In one exemplary embodiment, the cleaning apparatus 10 includes, one or more of the following modules: a pre-wash module, a wash module, a pre-rinse module, a rinse module, and a dry module. A control module having a user interface together indicated at 14 provides an operator the ability to program and monitor the cleaning apparatus 10.

The cleaning apparatus 10 further includes an elongate conveyor 16 that is configured to transport electronic substrates through the modules 12 of the cleaning apparatus. The conveyor 16 is designed to securely hold electronic substrates during the sometimes rigorous cleaning processes. Embodiments of the present disclosure are directed to improvements in the conveyor 16 and the ability to secure electronic substrates during the cleaning process.

Figure 2:
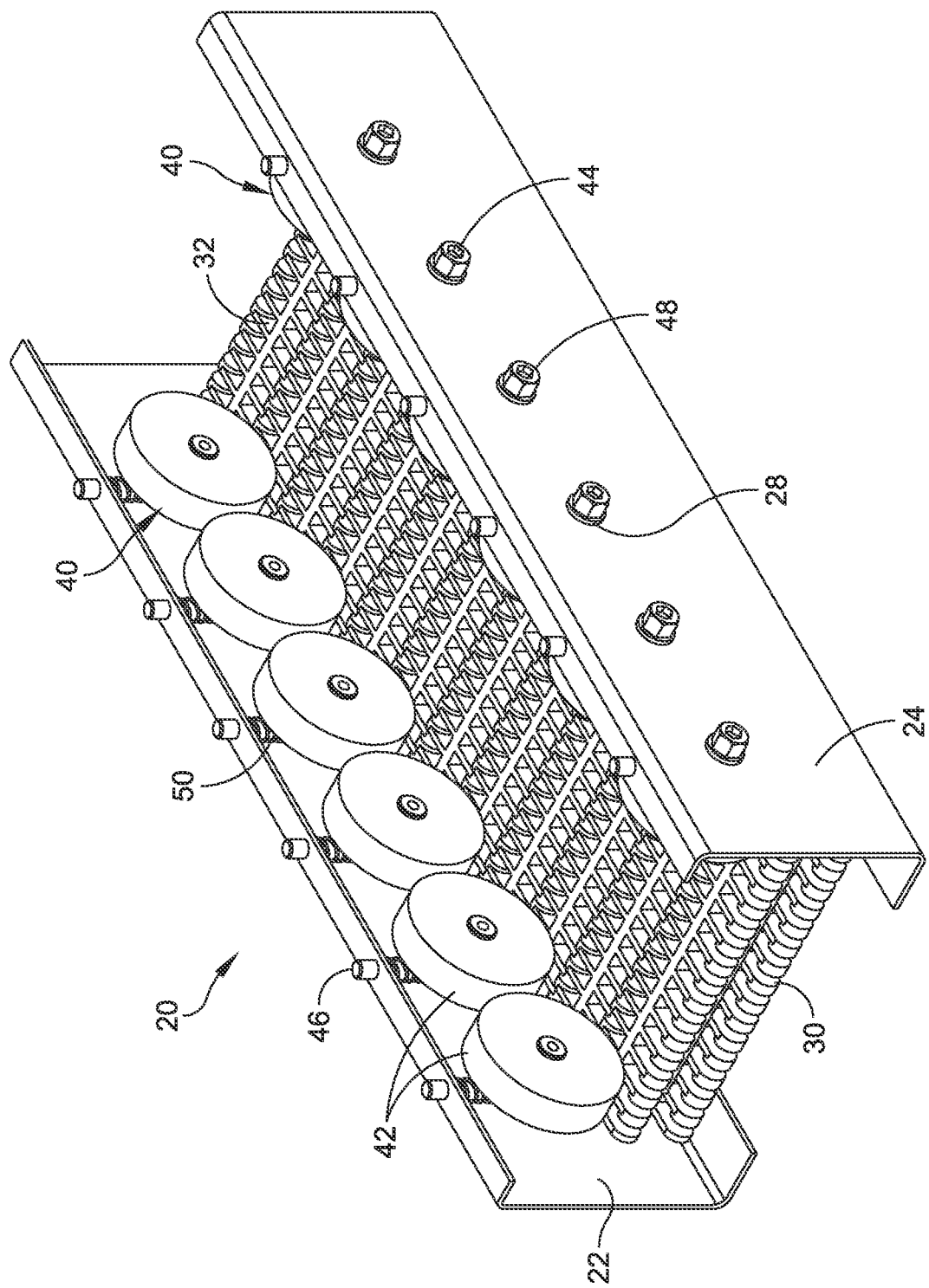
FIG. 2 is a perspective view of a hold down conveyor system of an embodiment of the present disclosure.

Referring to FIG. 2, a portion of a hold down conveyor system of an embodiment of the present disclosure is generally indicated at 20. As shown, the conveyor system 20 includes a first outer frame member 22 and a second outer frame member 24 that are spaced apart and suitably secured within a frame structure provided in the cleaning apparatus. In one embodiment, each outer frame member 22, 24 is C-shaped in construction to define an open channel. The arrangement is such that a channel of the first outer frame member 22 faces a channel of the second outer frame member 24. The first outer frame member 22 further includes a plurality of slotted openings, each indicated at 26, formed in line along a length of the frame member. Similarly, the second outer frame member 24 further includes a plurality of slotted openings, each indicated at 28, formed in line along a length of the frame member. The slotted openings 26, 28 are positioned roughly above a midline between a bottom outer flange of the frame member and a top outer flange of the frame member. The purpose of the slotted openings 26, 28 will be apparent as the description of the conveyor system 20 proceeds.

Figure 3:
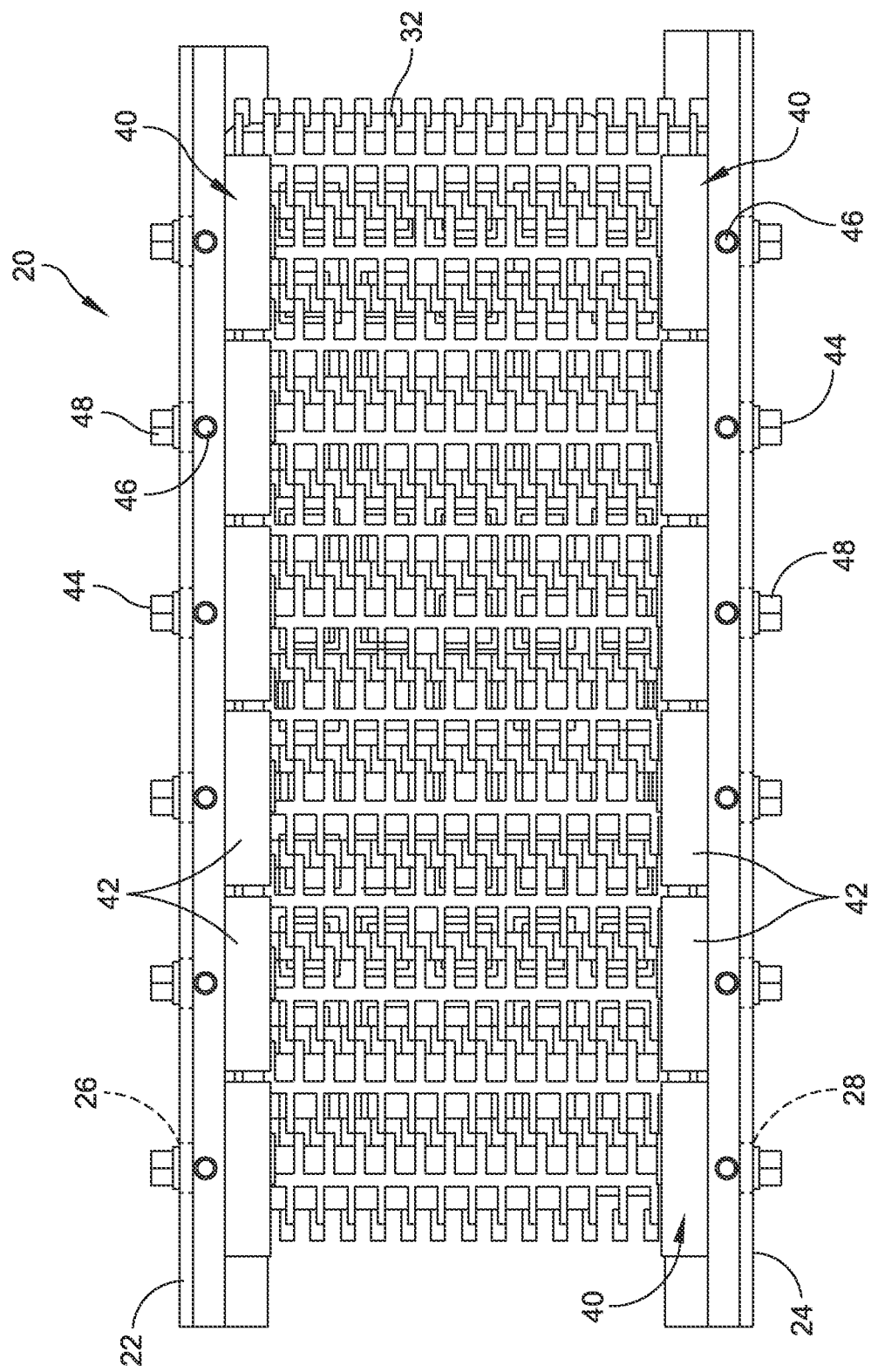
FIG. 3 is a top view of the hold down conveyor system.
Figure 4:
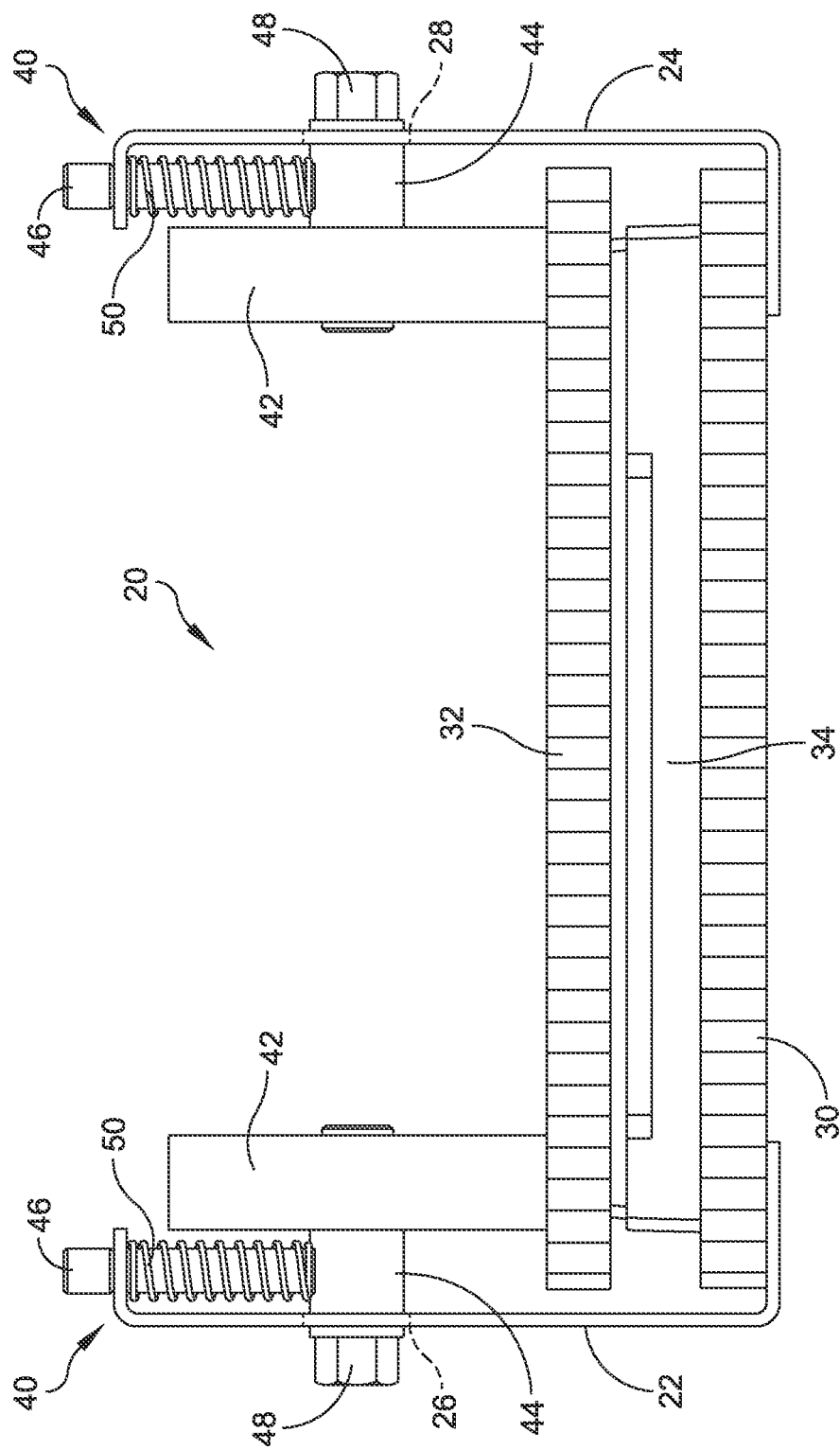
FIG. 4 is an end view of the hold down conveyor system.

Referring additionally to FIGS. 3 and 4, the conveyor system 20 further includes a bottom belt 30 and a top belt 32 spaced from the bottom belt. The bottom belt 30 and the top belt 32 are configured to receive a product carrier 34 therebetween to transport electronic substrates through the modules 12 of the cleaning apparatus 10. As shown, the belts 30, 32 are disposed between the first outer frame member 22 and the second outer frame member 24 and suitably coupled to the frame members to drive their respective rotations. In one embodiment, a belt drive system can be employed to power the rotations of at least one of the bottom belt 30 and the top belt 32. It should be understood that the rotation of the bottom belt 30, the top belt 32, or both, may be achieved by any type of drive system known in the art.

The conveyor system 20 further includes several roller assemblies, each generally indicated at 40. As shown, roller assemblies 40 are evenly spaced along inner surfaces of the first and second outer frame members 22, 24. Each roller assembly 40 includes a roller 42 that is positioned to engage the top belt 32 to apply force on the top belt, thereby securely engaging the product carrier 34 during transport of the product carrier along the conveyor system 20. As will be disclosed in greater detail below, the rollers 42 of the roller assemblies 40 are configured move up-and-down to ensure that force is applied somewhat uniformly and evenly to the top belt.

Each roller assembly 40 further includes a slide bolt 44 and a guide rod 46 to secure the roller 42 of the roller assembly to its respective outer frame member 22 or 24. As shown, the roller 42 of the roller assembly 40 is secured to its respective outer frame member 22 or 24 by the slide bolt 44, which extends through the slotted opening 26 or 28 with the slotted opening enabling relative longitudinal (up-and-down) movement of the slide bolt to finely position the roller 42 with respect to the top belt 32. Each slide bolt 44 is secured to the outer frame member 22 or 24 by a nut 48, with the roller 42 being rotatably mounted on the slide bolt to enable the roller to freely rotate about an axis of the slide bolt. Once properly located, the slide bolt 44 is secured to the outer frame member 22 or 24 by tightening the nut 48 to position the roller 42.

For each roller assembly 40, relative longitudinal (vertical) movement of the roller is provided by the guide rod 46, which is mounted on one end to a bottom flange of the outer frame member 22 or 24 and an opposite end to the slide bolt 44. Each guide rod 46 has a spring 50 that is retained between the upper flange of the outer frame member 22 or 24 and the body of the slide bolt 44. The spring 50 is best illustrated in FIG. 4. This construction enables the spring 50 to apply consistent (constant) force on the top belt 32 by the roller 42. The amount of force applied by the rollers 42 of the roller assemblies 40 to the top belt 32 can be varied by varying the spring force of the springs 50.

The arrangement is such that roller assemblies 40 provided along the inner sides of the first and second outer frame members 22, 24 provide even, distributed force on the top belt 32 of the conveyor system 20. This force ensures that the product carrier 34 transported by the bottom belt 30 and the top belt 32 of the conveyor system 10 is securely held in place during its travel through the cleaning apparatus 10.

It is to be clearly understood that the above description is intended by way of illustration and example only and is not intended to be taken by way of limitation, and that changes and modifications are possible. For example, the cleaning apparatus 10 described above may be any type of cleaning machine that is used to clean electronic substrates. Accordingly, other embodiments are contemplated, and modifications and changes could be made without departing from the scope of this application.

In one embodiment, the control module 14 of the cleaning apparatus 10 is configured with an operating system, e.g., a Windows®-based operating system, that provides familiar pull-down menus and has data-logging and barcode capability. The operating system is easily networked for downloading of recipes and remote access to operating data. The user interface enables quick and easy viewing of system pressures, water levels, pump and blower operation, temperature, and fill/drain operation.

In one embodiment, the cleaning apparatus 10 is configured with functional modules 12 that are designed to accomplish different tasks in removing contamination. Some modules maximize flooding, while others maximize impact force for cleaning tight spaces. The cleaning apparatus 10 uses proprietary pump and nozzle technology throughout the system to optimize performance.

In one embodiment, the cleaning apparatus 10 may be configured to have appropriately sized modules and strategic manifold placement increase throughput while ensuring thorough removal of contaminants. The cleaning apparatus 10 may include perforated rails, curtain containment, and a cabinet designed to manage wash solution within the system for maximum conservation of costly chemistries. The cleaning apparatus 10 further may include a wet chemical isolation module that is powered by the recirculating rinse pump to ensure optimal pre-rinsing and to facilitate closed-loop recycling of the rinse section. An exhaust may be separated between the wash and rinse modules to minimize chemical migration through the system.

The cleaning apparatus 10 enables efficient and complete drying during a cleaning process. The cleaning apparatus 10 is configured to increase throughput, providing cost savings and return on investment.

The importance of cleaning electronic assemblies increases dramatically with lead-free soldering. Higher temperatures are required in lead-free soldering, and wetting is much more difficult. To improve "wettability," flux compositions may require higher activation. High-solid flux formulations commonly leave more undesirable residue and require cleaning.

A successful cleaning system must be able to handle the harsh demands of the lead-free process. The cleaning apparatus 10 disclosed herein may be configured with unique cleaning nozzles that provide unmatched impact force to penetrate under and around components and clean even the most challenging flux residues.

Many process parameters may be configured in a computer-controlled operator interface provided in the cleaning apparatus 10. System pressure, water levels, and temperatures are easily accessed. Data logging and barcode capability are features that enhance and streamline the production process.

In some embodiments, the cleaning apparatus 10 may be configured to include nozzles, including "jet" nozzles, to apply a maximum direct dynamic impingement to the product surface and effectively clean under low stand-off components for difficult cleaning applications. The nozzles can be configured to produce large water droplets to enhance the cleaning performance of the cleaning apparatus when operating at a lower rate of pressure. The nozzles can be configured to produce an oscillating action to better clean and flush flux residues in a prewash to reduce foaming in the recirculating wash.

In some embodiments, the cleaning apparatus 10 can be equipped with orbitally welded, stainless steel plumbing to eliminate pressure drops and leaks, all sections can be replaced or upgraded in minutes to maximize uptime and process flexibility. Plumbing sections have quick-disconnect fittings for ease of maintenance.

In some embodiments, the cleaning apparatus 10 can be configured with an optional chemical isolation (CI) module, which is a multi-section module that efficiently removes chemistry from the product prior to the rinse section. The majority of the chemistry is removed in a first section, which is close-looped back into the wash tank reservoir.

In some embodiments, the cleaning apparatus 10 can be configured to include one or more drying modules, which are integrated into a cabinet of the cleaning apparatus. Typical performance includes drying complex assemblies to within 0.1 gram of prewashed dry weight. The module reduces exhaust requirements by 44% and uses 15% less power when compared with conventional drying systems, providing a rapid return on investment.

In some embodiments, the cleaning apparatus 10 can include one or more rear panels, which can be easily removed for maintenance with the added benefit of single door removal to access the wash and rinse tanks. Front doors further can be provided to provide quick access to electrical panels, computer, heaters, floats and thermocouples. The cleaning apparatus 10 can include hinged, tempered glass windows to provide optimum viewing and access.

Having thus described several aspects of at least one embodiment of this disclosure, it is to be appreciated various alterations, modifications, and improvements will readily occur to those skilled in the art. Such alterations, modifications, and improvements are intended to be part of this disclosure, and are intended to be within the spirit and scope of the disclosure. Accordingly, the foregoing description and drawings are by way of example only.

What is claimed is:

1. A cleaning apparatus for cleaning electronic substrates including printed circuit boards and semiconductor product assemblies, the cleaning apparatus comprising:
   at least one cleaning module configured to treat electronic substrates; and
   a conveyor system configured to transport the electronic substrates through the at least one cleaning module, the conveyor system including
     a first outer frame member,
     a second outer frame member spaced from the first outer frame member,
     a bottom belt disposed between the first outer frame member and the second outer frame member,
     a top belt spaced from the bottom belt, the bottom belt and the top belt being configured to receive a product carrier therebetween to transport electronic substrates along the conveyor system and through the at least one cleaning module, and
     a plurality of roller assemblies, at least one roller assembly being coupled to the first outer frame member and at least one roller assembly being coupled to the second outer frame member, each roller assembly being configured to apply a force on one of the top belt and the bottom belt, each of the first and second outer frame members being C-shaped in construction with a channel of the first outer frame member facing a channel of the second outer frame member,
   wherein each outer frame member includes a plurality of slotted openings formed in line along a length of the member, each slotted opening being configured to receive a roller assembly, and
   wherein each roller assembly includes a roller, a slide bolt to secure the roller to the outer frame member, and a guide pin to guide a vertical movement of the roller.

2. The cleaning apparatus of claim 1, wherein the roller assemblies are evenly spaced along inner surfaces of the first and second outer frame members and configured to engage the top belt to apply force on the top belt to secure the product carrier during transport along the conveyor system.

3. The cleaning apparatus of claim 1, wherein the slide bolt extends through the slotted opening and is secured to the outer frame member by a nut, with the roller being rotatably mounted on the slide bolt to enable the roller to freely rotate about an axis of the slide bolt.

4. The cleaning apparatus of claim 3, wherein a guide rod is mounted on one end to an upper flange of the outer frame member and an opposite end to the slide bolt.

5. The cleaning apparatus of claim 4, wherein each guide rod has a spring that is retained between the upper flange of the outer frame member and a body of the slide bolt, the spring being configured to apply force on the slide bolt and the roller.

6. The cleaning apparatus of claim 1, wherein the at least one module includes at least one of a pre-wash module, a wash module, a pre-rinse module, a rinse module, and a dry module.

7. The cleaning apparatus of claim 1, further comprising a control module having a user interface to provide an operator the ability to program and monitor the cleaning apparatus.

8. A conveyor system configured to transport the electronic substrates through the at least one cleaning module of a cleaning apparatus, the conveyor system comprising:
   a first outer frame member;
   a second outer frame member spaced from the first outer frame member;
   a bottom belt disposed between the first outer frame member and the second outer frame member;
   a top belt spaced from the bottom belt, the bottom belt and the top belt are configured to receive a product carrier therebetween to transport electronic substrates along the conveyor system and through the at least one cleaning module; and
   a plurality of roller assemblies, at least one roller assembly being coupled to the first outer frame member and at least one roller assembly being coupled to the second outer frame member, each roller assembly being configured to apply a force on one of the top belt and the bottom belt, each of the first and second outer frame members being C-shaped in construction with a channel of the first outer frame member facing a channel of the second outer frame member, wherein each outer frame member includes a plurality of slotted openings formed in line along a length of the member, each slotted opening being configured to receive a roller assembly, and wherein each roller assembly includes a roller, a slide bolt to secure the roller to the outer frame member, and a guide pin to guide a vertical movement of the roller.

9. The conveyor system of claim 8, wherein the roller assemblies are evenly spaced along inner surfaces of the first and second outer frame members and configured to engage the top belt to apply force on the top belt to secure the product carrier during transport along the conveyor system.

10. The conveyor system of claim 8, wherein the slide bolt extends through the slotted opening and is secured to the outer frame member by a nut, with the roller being rotatably mounted on the slide bolt to enable the roller to freely rotate about an axis of the slide bolt.

11. The conveyor system of claim 10, wherein a guide rod is mounted on one end to an upper flange of the outer frame member and an opposite end to the slide bolt.

12. The conveyor system of claim 11, wherein each guide rod has a spring that is retained between the upper flange of the outer frame member and a body of the slide bolt, the spring being configured to apply force on the slide bolt and the roller.

13. A method for cleaning electronic substrates with the cleaning apparatus of claim 1, the method comprising:
loading electronic substrates in a carrier device;
transporting the carrier device by the conveyor system through the at least one cleaning module; and
performing a cleaning operation.

14. A conveyor system configured to transport electronic substrates through at least one cleaning module of a cleaning apparatus, the conveyor system comprising:
a first outer frame member;
a second outer frame member spaced from the first outer frame member;
a bottom belt disposed between the first outer frame member and the second outer frame member;
a top belt spaced from the bottom belt, the bottom belt and the top belt are configured to receive a product carrier therebetween to transport electronic substrates along the conveyor system and through the at least one cleaning module; and
a plurality of roller assemblies, at least one roller assembly being coupled to the first outer frame member and at least one roller assembly being coupled to the second outer frame member, each roller assembly being configured to apply a force on one of the top belt and the bottom belt, each roller assembly includes a roller, a slide bolt to secure the roller to the outer frame member, and a guide pin to guide a vertical movement of the roller.

15. The conveyor system of claim 14, wherein each outer frame member includes a plurality of slotted openings formed in line along a length of the member, each slotted opening being configured to receive a roller assembly.

16. The conveyor system of claim 15, wherein the slide bolt extends through the slotted opening and is secured to the outer frame member by a nut, with the roller being rotatably mounted on the slide bolt to enable the roller to freely rotate about an axis of the slide bolt.

17. The conveyor system of claim 14, wherein each roller assembly further includes a guide rod mounted on one end to an upper flange of the outer frame member and an opposite end to the slide bolt.

18. The conveyor system of claim 17, wherein each guide rod has a spring that is retained between the upper flange of the outer frame member and a body of the slide bolt, the spring being configured to apply force on the slide bolt and the roller.

19. The conveyor system of claim 14, wherein the roller assemblies are evenly spaced along inner surfaces of the first and second outer frame members and configured to engage the top belt to apply force on the top belt to secure the product carrier during transport along the conveyor system.

* * * * *